(12) United States Patent
Andricacos et al.

(10) Patent No.: US 6,416,812 B1
(45) Date of Patent: Jul. 9, 2002

(54) METHOD FOR DEPOSITING COPPER ONTO A BARRIER LAYER

(75) Inventors: Panayotis Andricacos, Croton-on-Hudson; Steven H. Boettcher, Fishkill; Fenton Read McFeely, Ossining; Milan Paunovic, Port Washington, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/605,871

(22) Filed: Jun. 29, 2000

(51) Int. Cl.[7] .............................. B05D 5/12; B05D 7/22; B05D 1/18
(52) U.S. Cl. .................... 427/98; 427/97; 427/123; 427/230; 427/239; 427/437; 427/443.1
(58) Field of Search .......................... 427/98, 123, 97, 427/230, 239, 437, 443.1; 106/1.23

(56) References Cited

U.S. PATENT DOCUMENTS

| 4,548,644 A | * | 10/1985 | Nakaso et al. | 106/1.23 |
| 5,851,917 A | * | 12/1998 | Lee | 438/627 |
| 5,891,513 A | * | 4/1999 | Dubin et al. | 427/98 |
| 5,920,790 A | * | 7/1999 | Wetzel et al. | 438/618 |
| 6,221,763 B1 | * | 4/2001 | Gilton et al. | 438/643 |
| 6,284,652 B1 | * | 9/2001 | Charneski et al. | 438/653 |

* cited by examiner

Primary Examiner—Michael Barr
(74) Attorney, Agent, or Firm—Connolly Bove Lodge & Hutz; Robert M. Trepp

(57) ABSTRACT

Copper is deposited onto a barrier layer such as tungsten from an electroless copper plating bath having a pH of at least 12.89 and a deposition rate of 50 nanometers/minute or less.

18 Claims, 2 Drawing Sheets

METHOD FOR DEPOSITING COPPER ONTO A BARRIER LAYER

TECHNICAL FIELD

The present invention relates to depositing copper onto a barrier or liner layer and especially concerned with providing a conformal adherent copper film.

The present invention finds particular applicability for VLSI and ULSI metal interconnects, studs, for CMOS gate stacks on semiconductor chips and for electrical interconnections in packaging and display sources.

The present invention is especially advantageous for depositing copper in high aspect ratio/trench structures (>3:1 depth/width).

BACKGROUND OF INVENTION

Al(Cu) and its related alloys are a preferred alloy for forming interconnections on electronic devices such as integrated circuit chips. The amount of Cu in Al(Cu) is typically in the range from 0.3 to 4%.

Replacement of Al(Cu) by Cu and Cu alloys as a chip interconnection material results in advantages of performance. Performance is improved because the resistivity of Cu and certain copper alloys is less than the resistivity of Al(Cu), thus narrower lines can be used and higher wiring densities will be realized.

When fabricating high performance interconnect structures, the Cu conductive wiring material must be embedded into a dielectric material having a trench or via formed therein. The dielectric material may comprise an organic as well as an inorganic material, or combination thereof. Examples of such materials include polyimides, parylene polymers, polyarylene ether polymers, diamond-like carbon, materials comprising various amounts of carbon, silicon, oxygen and hydrogen, polysiloxanes, $SiO_2$ and $Si_3N_4$. Such materials may be either dense or porous.

While Cu is the conductor of choice in such applications, it possesses an important undesirable property with respect to its interaction with the dielectric matrix. Copper generally diffuses through the dielectric material at the moderately elevated temperatures encountered during subsequent processing. This can have a number of deleterious consequences, including the possible short-circuiting of the wires or degradation of the performance of the MOS devices to which they are wired. To prevent these effects, it is therefore necessary to incorporate a diffusion barrier into the structure, isolating the Cu from the dielectric.

Among the materials suggested as barrier materials are tungsten (W) and its alloys, titanium, alloys of titanium, titanium nitride, tantalum, tantalum alloys, tantalum nitride and tantalum silicon nitride.

However, various coating methods which might be employed to form the copper wire, such as electroplating, evaporation, or electroless deposition from solution, result in unacceptably poor adhesion between the diffusion barrier and the copper wire. As a consequence, the structure thus formed lacks the ruggedness necessary to withstand subsequent processing steps, such as chemical-mechanical polishing (CMP) without incurring catastrophic structural failure.

As a consequence of the above adhesion problem, it has been found necessary in practice to deposit the Cu comprising the wire in two distinct steps. The first of these steps is to coat the diffusion barrier with a thin layer of Cu, typically a few hundred angstroms thick. In current practice, this layer, referred to as the seed layer, is deposited by sputter deposition as this has been the sole method discovered heretofore which provides good adhesion between the Cu and any of the materials used for the diffusion barrier layer. Once the seed layer is in place, the remainder of the Cu comprising the wire may be deposited by a number of methods, such as CVD or electroplating, as the adhesion between the bulk wire Cu and the seed layer Cu is not a problem. Two steps are required because it is impractical to fabricate the whole of the wire by sputter deposition, for a variety of reasons.

The necessity heretofore of using sputter deposition to form the seed layer leads to a second major problem. This is the problem of conformality. In practice today, and increasingly in the future, high performance wiring structures will contain high aspect ratio trenches in the dielectric. The aspect ratio is defined as the ratio of the depth of the trench to its width, and high aspect ratio refers to ratios of 3:1 or greater. Sputter deposition is inherently a poorly conformal process so that it is difficult to achieve adequate coverage of the seed layer on the side walls of the trench. This is undesirable as it will lead to a weakening of the structure. While sputter deposition processes may be "tuned" and modified by means well known to those skilled in the art so as to optimize the degree of conformality, this inherently involves complex and costly apparatus, and it is not apparent that it can be extended to meet foreseeable needs.

It would therefore be highly desirable to have a low cost, inherently conformal method to form the seed layer to replace sputter deposition.

A suggestion of a particular electroless copper deposition on a CVD tungsten diffusion barrier can be found in Mak et al, *Electrochemical Society Proceedings,* Vol. 93-20, 1993, Romankiw et al (Eds.), p. 233. Chemical vapor deposition (CVD) of the tungsten was achieved by the selective tungsten process using $WF_6$ as tungsten source. In this process, W deposits selectively only on the bottom of exposed Si vias and trenches patterned in silicon dioxide, but not on silicon dioxide ($SiO_2$). Subsequently, electroless copper is deposited selectively on the tungsten surfaces. FIG. 1 shows schematic representation of a Cu interconnection formed by the selective tungsten-electroless copper process. It is seen from FIG. 1 that Cu interconnection according to this process has diffusion barrier only on the bottom of interconnection. Thus, only diffusion of Cu into Si is blocked. However, Cu atoms may diffuse not only from the bottom of interconnections but also from the sides or the tops of the interconnections. Diffusion of Cu from the sides into $SiO_2$ degrades the $SiO_2$ insulator and results in defects. Thus, the product of this process is not satisfactory.

In another technique, silicon is implanted on the bottom of the $SiO_2$ trench and then CVD W is selectively deposited on the implanted silicon. Electroless copper is selectively deposited on tungsten to produce the Cu interconnection (Angyal et al, *Electrochemical Society Extended Abstracts,* 93-1, 1993, p. 465). In this process, like in the previous one, Cu diffusion is blocked only at the bottom but not at the sides and Cu may easily diffuse into the $SiO_2$ insulator. Thus, this process is not satisfactory either. FIG. 2 shows schematic representation of the process with Si seed layer implant.

Therefore, it would also be desirable to provide a process capable of fabricating completely encapsulated copper interconnections for integrated circuits.

SUMMARY OF INVENTION

The present invention makes it possible to conformally deposit the seed layer by a relatively low-cost and simple method.

It has been found according to the present invention that copper can be deposited from certain electroless deposition baths. Since electroless deposition does not involve the application of external electrical potentials, and does not possess any other characteristic which externally imposes a unique axis in space (such as the direction of propagation of the ion beam in sputtering process) it is inherently a conformal process and solves the problem of conformality. The present invention also solves the problem of adhesion which has heretofore prevented the use of electroless deposition for this purpose by employing compositions having certain characteristics. More particularly, the copper electroless plating baths employed pursuant to the present invention have a pH of at least 12.89 and a deposition rate of 50 nanometers/minute or less.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
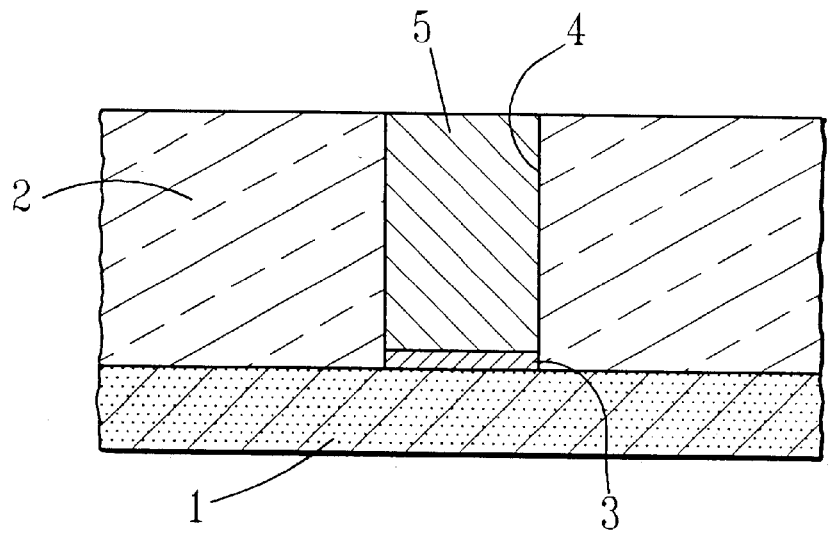
FIGS. 1 and 2 are cross-sectional views of examples of prior art structures.

In order to facilitate an understanding of the present invention, reference will be made below to the figures.

The present invention relates to interconnect structures for semiconductor devices and, in particular, to structures comprising Cu interconnect lines placed in trenches in a dielectric matrix, featuring a liner or barrier between the Cu and the dielectric. The present invention provides a method to conformally form an adherent layer of Cu on the barrier layer to enable the fabrication of the body of the Cu wire by a variety of means, such as electroplating or chemical vapor deposition (CVD), or to form the entire Cu wire body in a single step.

The present invention may be applied in the fabrication of any interconnect structures in which Cu wires may be used in conjunction with barrier layers in a dielectric matrix. This includes, but is not limited to, damascene structures, memory cell capacitors, and all other wiring applications for logic, memory and input/output applications. The method may also be employed quite generally in any application where it is necessary to deposit a thin adherent layer of Cu onto a barrier metal without any intervening layer, especially in those instances where conformality and the precise control of thickness in the 10 nm–100 nm regime and preferably about 20 to about 50 nm are concerns.

It has been found according to the present invention that in order to achieve a conformal coating that exhibits adequate adhesion between the barrier layer and copper, and having a controlled thickness, electroless plating bath having a pH of at least about 12.89 and a plating rate of 50 nanometers/minute or less is to be used.

More particularly, the copper electroless aqueous plating baths comprise a source of cupric ions, a reducing agent for the cupric ions, a complexing agent for the cupric ions and pH adjustor. The plating bath can also include optional components such as stabilizers, surface active agents and cyanide ions.

Typically the plating baths comprise about 0.015 M (molar) to about 0.2 M and more typically about 0.05 M to about 0.10 M of the cupric ion source.

The reducing agent is typically present in amounts of about 0.01 M to about 0.2 M and more typically about 0.01 M to about 0.1 M.

The complexing agent is typically present in an amount of about 0.02 M to about 0.3 M and more typically about 0.1 M to about 0.2 M.

When present, the stabilizer is typically present in amounts of about 1 $\mu$M to about 50 $\mu$M and more typically about 5 $\mu$M to about 20 $\mu$M.

The cyanide ion, when employed, is typically present in amounts of about 1 mg/L to about 200 mg/L and more typically about 5 mg/L to about 50 mg/L.

When present, the surface active agent is present in amounts of about 0.1 mg/L to about 500 mg/L and more typically about 2 mg/L to about 300 mg/L.

The cupric ion source generally used is a cupric sulfate (e.g. $CuSO_4.5H_2O$) or a cupric salt of the complexing agent to be employed.

Examples of some other reducing agents include formaldehyde precursors or derivatives such as paraformaldehyde, trioxane, dimethylhydantoin, glyoxal; glyoxylic acid, borohydrides such as alkali metal borohydrides (sodium and potassium borohydride) and substituted borohydrides such as sodium trimethoxy borohydride; boranes such as amine borane (isopropyl amine borane and morpholine borane) and hypophosphites.

Examples of some suitable complexing agents include Rochelle salts, ethylene diamine tetraacetic acid, the sodium (mono-, di-, tri-, and tetra-sodium) salts of ethylene diamine tetraacetic acid, nitrolotetraacetic acid and its alkali salts, gluconic acid, gluconates, triethanol amine, glucono (gamma)-lactone, modified ethylene diamine acetates such as N-hydroxyethyl, and ethylene diamine triacetate. In addition, a number of other suitable cupric complexing agents are suggested in U.S. Pat. Nos. 2,996,408; 3,075,856; 3,075,855 and 2,938,805. The amount of complexing agent is dependent upon the amount of cupric ions present in the solution.

The pH adjustor can be a basic compound such as sodium hydroxide, potassium hydroxide or tetraethylammonium hydroxide.

Examples of some cyanides which can be employed according to the present invention are the alkali metal, alkaline earth metal, and ammonium cyanides. In addition, the plating bath can include other minor additives as is known in the art.

A preferred source of cupric ions is $CuSO_4.5H_2O$.

A particular example of a suitable complexing agent is ethylenediamine tetraacetic acid (EDTA) or salts thereof.

A particular example of a reducing agent is formaldehyde.

A suitable stabilizer is 2,2'-dipyridyl.

A specific example of a surface active agent is Triton X-114 (polyoxyethylene isoctylphenyl ether).

A preferred pH adjusting agent is sodium hydroxide.

FIG. 1 as discussed above illustrates a prior suggested structure wherein tungsten 3 is deposited by chemical vapor deposition only on the bottom of the trench 4 on exposed silicon 1. The tungsten 3 does not block the Cu 5 from diffusion into the dielectric 2 such as $SiO_2$.

Figure 2:
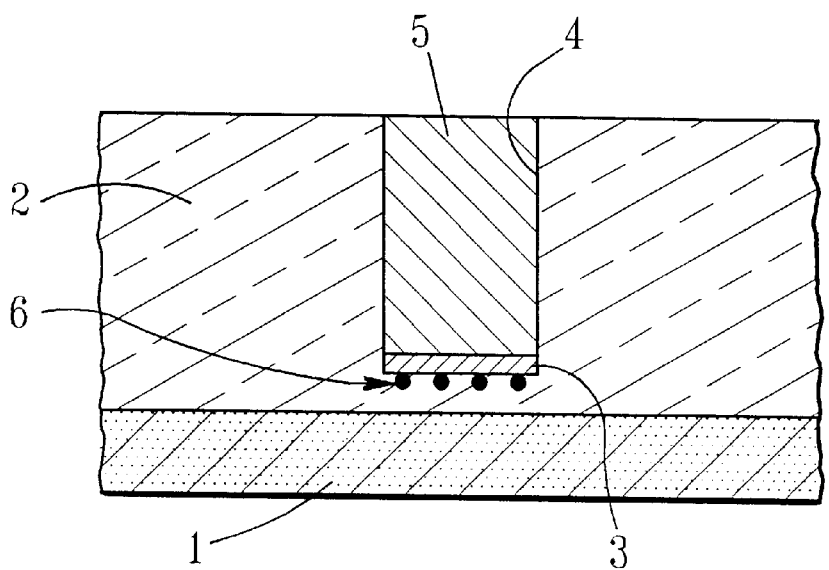

FIG. 2 as discussed above illustrates another prior suggested structure wherein silicon 6 is implanted on the bottom of the trench 4 patterned in silicon dioxide 2. CVD deposited tungsten 3 is selectively deposited on the implanted silicon 6. The tungsten 3 does not block the Cu 5 from diffusion into the $SiO_2$ dielectric 2.

Figure 3:
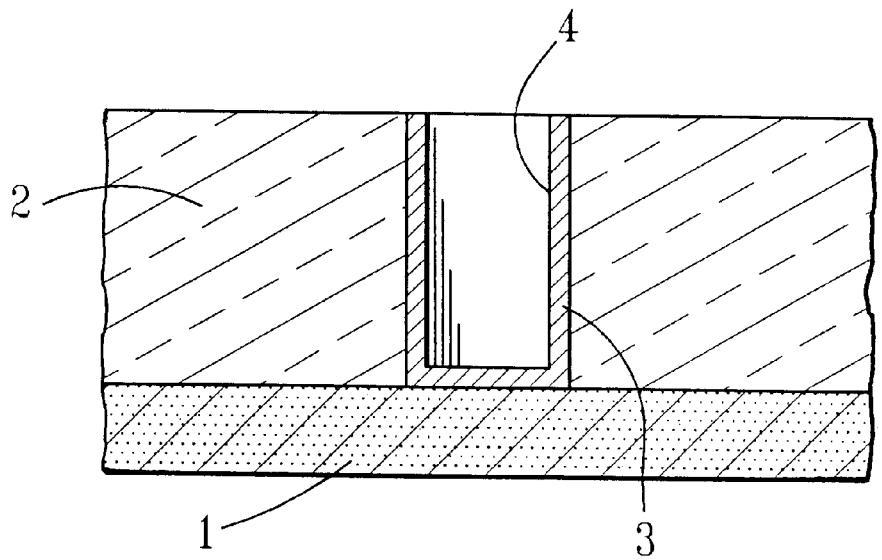
FIGS. 3 and 4 are cross-sectional views of a structure according to the present invention.

FIG. 3 illustrates a structure according to the present invention wherein the barrier layer 3 is deposited on the bottom and sidewalls of the trench, via or contact hole in the insulator 2 such as silicon dioxide. Examples of some barrier layers are tungsten, alloys of tungsten, titanium, alloys of titanium, titanium nitride, tantalum, tantalum from diffusion into the $SiO_2$ dielectric 2.

FIG. 3 illustrates a structure according to the present invention wherein the barrier layer 3 is deposited on the bottom and sidewalls of the trench, via or contact hole in the insulator 2 such as silicon dioxide. Examples of some barrier layers are tungsten, alloys of tungsten, titanium, alloys of titanium, titanium nitride, tantalum, tantalum alloys, tantalum nitride and tantalum silicon nitride, with tungsten being the preferred barrier layer.

The tungsten can be deposited by CVD using $W(CO)_6$ as the source of tungsten. This process can be carried out under high vacuum such as about $10^{-9}$ torr base pressure, at a typical deposition temperature of about 350° C. to about 500° C. and more typically about 380° C. to about 400° C. The partial pressure of the reactant gas is typically about 1 to about 100 m torr and more typically about 5–20 m torr. Other methods of non-selective deposition and being substantially conformal for the tungsten such as CVD utilizing a tungsten halide precursor evaporation or sputter deposition can be employed. The layer 3 is typically at least about 4 nm, more typically about 5 nm to about 40 nm and preferably about 5 nm to about 10 nm.

Figure 4:
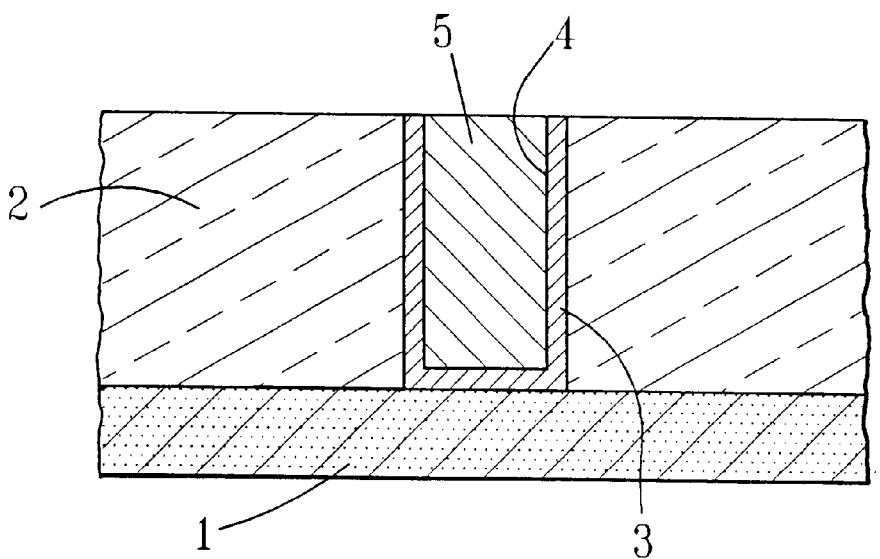

The copper 5 is then selectively deposited on the barrier layer employing the plating baths according to the present invention. See FIG. 4.

The following non-limiting examples are presented to further illustrate the present invention.

EXAMPLE 1

A substrate, comprising patterned $SiO_2$ on a silicon wafer, was coated with tungsten. The tungsten was deposited by chemical vapor deposition (CVD) employing $W(CO)_6$ as the precursor. The deposition is carried out under high vacuum system at about $1 \times 10^{-9}$ torr base pressure and a temperature of about 380–400° C. The partial pressure of the $W(CO)_6$ is about 10 m torr. The tungsten layer is about 20 nanometers thick.

Copper is then selectively coated onto the tungsten from an electroless copper plating bath having a pH of 12.89 and containing the following:

| | |
|---|---|
| $CuSO_4.5H_2O$ | 12.5 g/L |
| $Na_2EDTA$ | 37.2 g/L (EDTA, ethylenediaminetetraacetic acid) |
| 2,2'-dipyridyl | 0.015–0.0156 g/L |
| Triton X-114 | 0.10–0.30 mL/L (Triton X-114: polyoxyethylene (8) isooctylphenyl ether) |
| $CH_2O$ | 6.0 mL/L (formaldehyde, 37% solution) |
| $H_2O$ | to 1 L |
| NaOH | to provide a pH of 12.89 |

The plating is carried out at bath temperatures of about 60° C. The plating rate is about 50 nanometers/minute, enabling precise control of the coating thickness. The copper exhibited good adhesion characteristics.

Comparison Example 2

Example 1 is repeated except that the copper plating bath has a pH of about 12.17. A continuous and shiny Cu film was deposited, but the adhesion between the Cu and the W substrate was unacceptably poor.

Comparison Example 3

Example 1 is repeated except that the copper plating bath has a pH of less than 12.17. No copper deposition occurred.

Comparison Example 4

Example 1 was repeated except that the plating bath was LeaRonal Coppermerse 80 solution having a pH of 13.0–13.2, a commercially available bath. The bath has a deposition rate in excess of 200 nanometers/minute, which is too high for adhering a controlled thickness over a typical wafer. Even though the copper deposit produced an adherent coating, the example is not suitable because of its deposition rate.

EXAMPLE 5

Comparison example 4 is repeated except that sodium cyanide is added to the LeaRonal Coppermerse 80 solution. This was effected by adding 5 ml/L of LeaRanal "Component 80 p" solution (a standard sodium cyanide solution) to the copper plating bath. This successfully reduced the deposition rate to 50 nanometers/minute. The copper deposit was an adherent coating and suitable for the present invention.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for the deposition of copper directly onto a barrier layer which comprises depositing the copper from an electroless plating bath comprising a source of cupric ions, a reducing agent, and a complexing agent having pH of at least 12.89 and a deposition rate of 50 nanometers/minute or less directly onto the barrier layer, wherein no seed layer is present between said barrier layer and said copper.

2. The method of claim 1 wherein the copper is deposited to provide a thickness of about 10 nanometers to about 100 nanometers.

3. The method of claim 1 wherein the copper is deposited to provide a thickness of about 20 to about 50 nanometers.

4. The method of claim 1 wherein the barrier layer is located on the bottom and sidewalls of a trench or via embedded in a dielectric.

5. The method of claim 4 wherein the barrier layer is selected from the group consisting of tungsten, alloys of tungsten, titanium, alloys of titanium, titanium nitride, tantalum, tantalum nitride and tantalum silicon nitride.

6. The method of claim 5 wherein the barrier layer has a thickness of at least about 4 nanometers.

7. The method of claim 4 wherein the barrier layer is tungsten.

8. The method of claim 4 wherein the dielectric is silicon dioxide.

9. The method of claim 1 wherein the barrier layer is selected from the group consisting of tungsten, alloys of tungsten, titanium, alloys of titanium, titanium nitride, tantalum, tantalum nitride and tantalum silicon nitride.

10. The method of claim 1 wherein the barrier layer has a thickness of at least about 4 nanometers.

11. The method of claim 1 wherein the barrier layer is tungsten.

12. The method of claim 4 wherein the trench or via has an aspect ratio of greater than 3:1.

13. The method of claim 1 wherein the plating bath is at a temperature of about 60° C.

14. The method of claim 1 wherein the source of cupric ions is $CuSO_4$, the reducing agent is formaldehyde and the complexing agent is EDTA or salt thereof.

15. The method of claim 14 wherein the plating bath comprises sodium hydroxide.

16. The method of claim 1 wherein the plating bath further comprises a stabilizer and surfactant.

17. The method of claim 16 wherein the stabilizer is 2,2'-dipyridyl.

18. The method of claim 1 wherein the plating bath further comprises cyanide ions.

* * * * *